US 8,242,490 B2

(12) United States Patent
Hong et al.

(10) Patent No.: US 8,242,490 B2
(45) Date of Patent: Aug. 14, 2012

(54) ORGANIC LIGHT EMITTING DEVICE

(75) Inventors: Sang-Min Hong, Yongin (KR);
Hee-Chul Jeon, Yongin (KR); Sung-Joo Hwang, Yongin (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 112 days.

(21) Appl. No.: 12/831,118

(22) Filed: Jul. 6, 2010

(65) Prior Publication Data

US 2011/0233527 A1 Sep. 29, 2011

(30) Foreign Application Priority Data

Mar. 29, 2010 (KR) .................. 10-2010-0028081

(51) Int. Cl.
*H01L 51/00* (2006.01)

(52) U.S. Cl. ............. 257/40; 257/59; 257/72; 257/91; 257/99; 257/E27.121; 257/E27.133; 257/E51.019

(58) Field of Classification Search ............. 257/40, 257/59, 72, 91, 99, E27.121, E27.133, E51.019
See application file for complete search history.

(56) References Cited

U.S. PATENT DOCUMENTS

2005/0116630 A1* 6/2005 Kim et al. ............. 313/506
2010/0141612 A1* 6/2010 Desieres et al. ............. 345/204

FOREIGN PATENT DOCUMENTS

KR 10-2007-0024810 A 3/2007
KR 10-2007-0066251 A 6/2007

* cited by examiner

*Primary Examiner* — Tu-Tu Ho
(74) *Attorney, Agent, or Firm* — Knobbe, Martens, Olson & Bear LLP

(57) ABSTRACT

An organic light emitting device is disclosed. In one embodiment, the device includes a plurality of pixels formed on a substrate, wherein each of the pixels includes: a first electrode layer formed on the substrate; an organic emission layer formed on the first electrode layer and a second electrode layer formed on the organic emission layer. Further, at least one of the first electrode layers of the pixels is externally patterned.

17 Claims, 6 Drawing Sheets

ORGANIC LIGHT EMITTING DEVICE

RELATED APPLICATIONS

This application claims priority to and the benefit of Korean Patent Application No. 10-2010-0028081 filed in the Korean Intellectual Property Office on Mar. 29, 2010, the entire contents of which are incorporated herein by reference.

BACKGROUND

1. Field

The described technology generally relates to an organic light emitting device, and more specifically, to an organic light emitting device for reducing external light reflection.

2. Description of the Related Technology

Generally, an organic light emitting diode (OLED) generates excitons by recombining electrons and holes injected through a cathode and an anode from a low molecular or high molecular weight organic thin film and generates light with a specific wavelength determined by the energy of the generated excitons.

The OLED is made up of a plurality of organic light emitting elements which are called pixels. The organic light emitting device includes a pixel array in which a plurality of organic light emitting elements are densely arranged. Generally, in the pixels of organic light emitting elements displaying color images, three pixels one each emitting red, green, and blue light form one display unit. These display units are repeatedly arranged.

SUMMARY

One aspect is an organic light emitting device having a pixel structure capable of improving outdoor visibility.

Another aspect is an organic light emitting device which reduces external light reflection without loss of luminance and without adversely affecting the organic emission layers.

Another aspect is an organic light emitting device including a plurality of pixels formed on a substrate, the pixel including: a first electrode layer formed on the substrate; an organic emission layer formed on the first electrode layer; and a second electrode layer formed on the organic emission layer, wherein at least one first electrode in the plurality of pixels is subjected to external patterning.

The plurality of pixels are R, G, and, B pixels. The first electrode in the R, G and B pixels is subjected to the external patterning. The external patterning of the first electrode may be alternately formed with respect to the first electrodes of the adjacent pixels.

The external patterning may be formed at the mutually facing edge parts between the plurality of pixels. The external patterning is formed in a groove shape formed at the edge part. The external patterning is formed within 50% of a total length of the edge part.

The external patterning is formed in the depth where the organic emission layer is positioned from the edge part. The external patterning may be performed on the edge part in the plurality of groove shapes that are spaced from each other at a predetermined interval. The groove may be formed in a rectangular shape. The groove may be formed in a circular arc shape or an oval shape.

The central axis of the external patterning formed in any one of the plurality of pixels is formed so as not to overlap with the central axis of the external patterning formed in the adjacent pixel. Another aspect is an organic light emitting device including a plurality of pixels formed on a substrate, wherein each of the pixels comprises: a first electrode layer formed on the substrate; an organic emission layer formed on the first electrode layer; and a second electrode layer formed on the organic emission layer, wherein at least one of the first electrode layers of the pixels is externally patterned.

In the above device, the pixels are red (R), green (G), and, blue (B) pixels. In the above device, all of the first electrodes of the R, G and B pixels are externally patterned. In the above device, each of the first electrode layers of the pixels has two opposing sides which face at least one side of the first electrode layer of an adjacent pixel, and wherein at least one of the two opposing sides is externally patterned.

In the above device, a plurality of grooves are formed in each of the opposing sides. In the above device, the grooves of the first electrode layer are alternately formed with respect to the grooves of the adjacent first electrode layer. In the above device, each of the grooves has substantially the same length and depth.

In the above device, the length of the grooves is less than about 50% of the length of each of the opposing sides of the first electrode layer. In the above device, the grooves do not contact the organic emission layer. In the above device, the grooves have a substantially rectangular shape. In the above device, the grooves have an arc shape or an oval shape.

In the above device, the central axis of each of the grooves in one of the pixels does not overlap with the central axis of each of the grooves in an adjacent pixel. In the above device, the grooves are formed only in the two opposing sides of each of the first electrode layer. In the above device, a plurality of grooves are formed in more than two sides of the first electrode layer, and wherein at least one of the sides does not face the first electrode layer of an adjacent pixel.

Another aspect is an organic light emitting device, comprising: a substrate; and a plurality of pixels formed over a substrate, wherein each of the pixels comprises: first and second electrodes formed over the substrate, wherein the first electrode is closer to the substrate than the second electrode; and an organic emission layer formed between the first and second electrodes, wherein each of the first electrodes of the pixels has two opposing sides which face at least one side of the first electrode of an adjacent pixel, and wherein at least one of the two opposing sides is patterned.

In the above device, a plurality of grooves are formed in each of the opposing sides. In the above device, the grooves of the first electrode are alternately formed with respect to the grooves of the adjacent first electrode.

Another aspect is an organic light emitting device, comprising: a substrate; first, second and third pixels formed over the substrate, wherein the second pixel is formed between and spaced apart from the first and third pixels, wherein each of the first, second and third pixels comprises: an organic emission layer; and an electrode formed below the organic emission layer, wherein the electrode is closer to the substrate than the organic emission layer, wherein the first electrode of the second pixel has two opposing sides which face the first electrodes of the first and third pixels, and wherein a plurality of grooves are formed in each of the opposing sides.

In the above device, an at least one of the first and third pixels has two opposing sides which face the two opposing sides of the second pixel, and wherein a plurality of grooves are formed in each of the opposing sides of the first and/or third pixel.

In the above device, the grooves of the second pixel are alternately formed with and face the grooves of the first and/or third pixels so that the central axis of each of the grooves in the second pixel does not overlap with the central axis of each of the grooves in the first and/or third pixels.

DETAILED DESCRIPTION

An organic light emitting element generally includes an anode, a cathode, and an organic emission layer interposed between the anode and the cathode. The organic emission layer may be divided into several layers according to its function. The emission layer may be formed in a multi-layered structure that includes at least one of a hole injection layer (HIL), a hole transfer layer (HTL), a hole blocking layer (HBL), an electron transport layer (ETL), and an electron injection layer (EIL).

Figure 1:
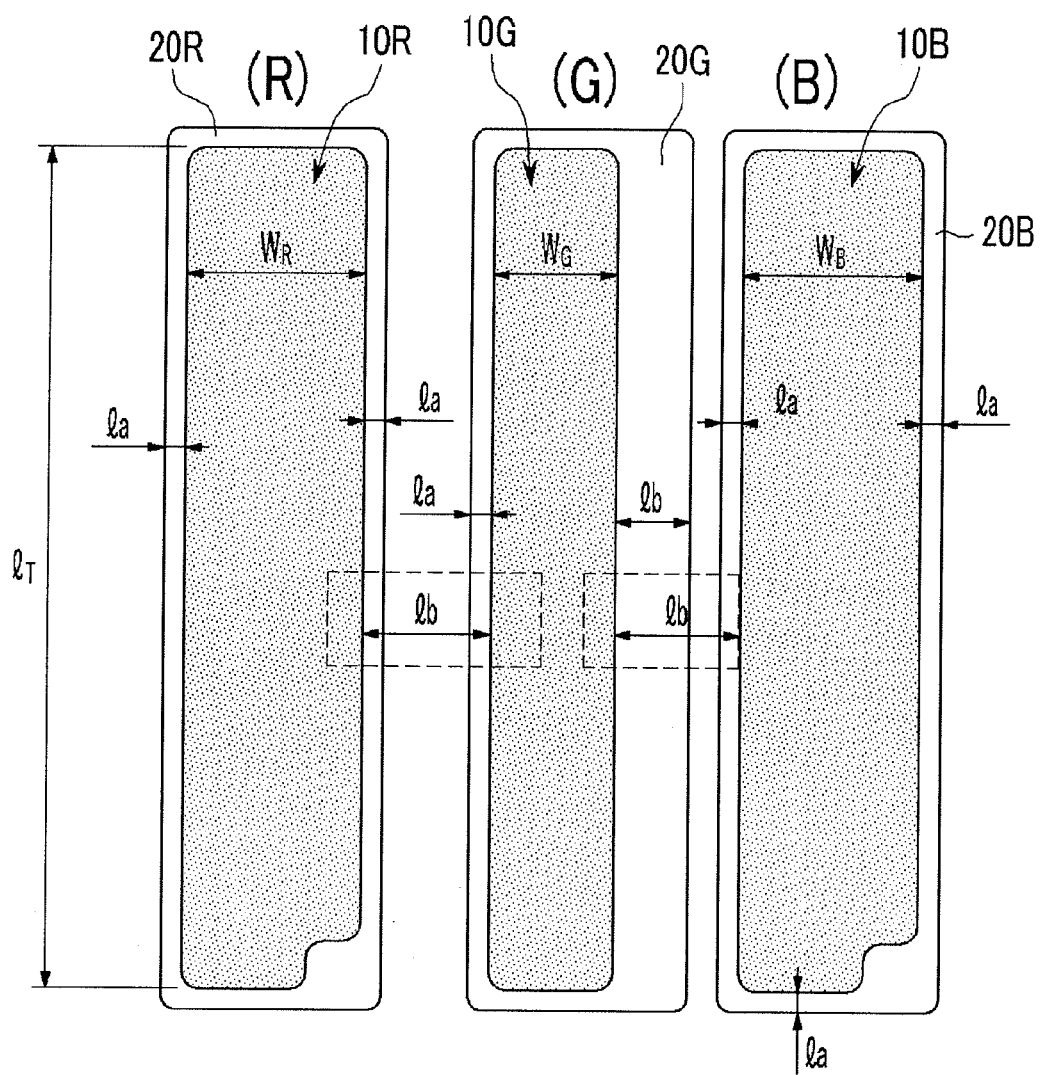
FIG. 1 is a diagram showing a pixel structure of an organic light emitting device.
Figure 2:
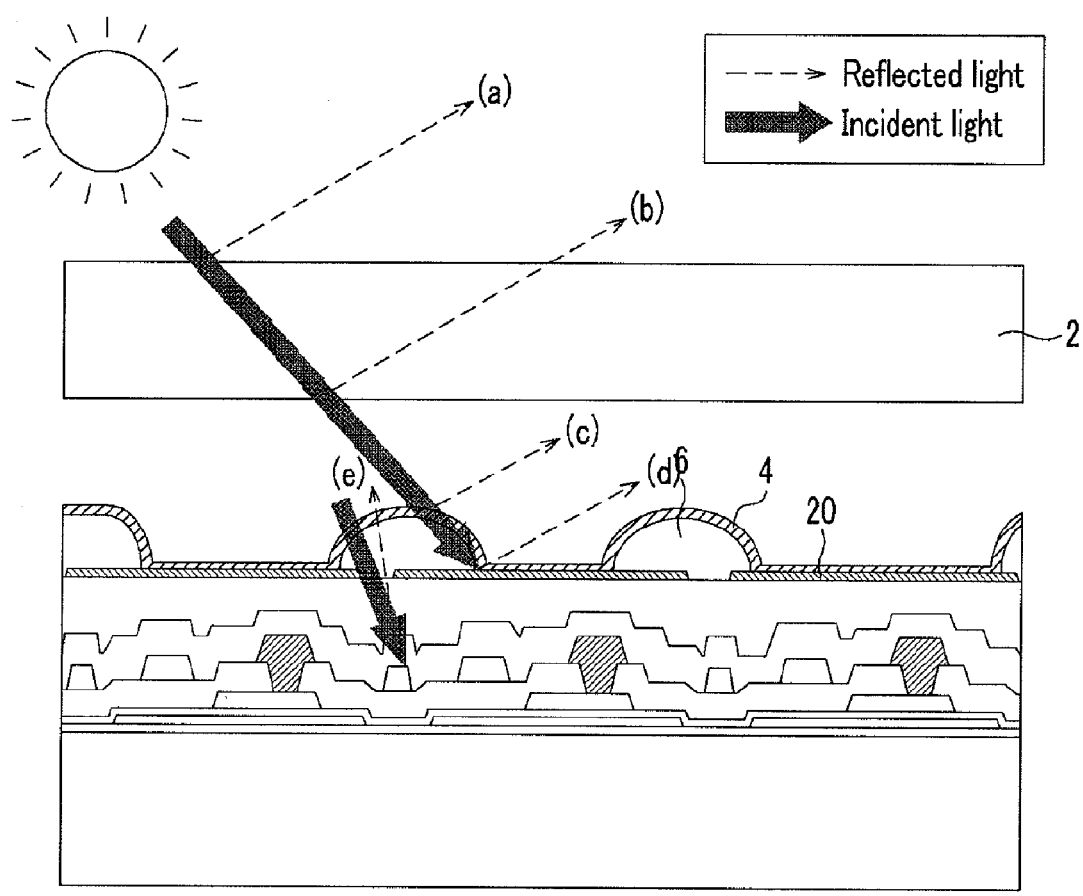
FIG. 2 is a cross-sectional view of the organic light emitting device shown in FIG. 1.

FIG. 1 is a plan view of an anode of an organic light emitting device and an organic emission layer. FIG. 1 shows a GA-4 inch model having a sub-pixel size of 62 μm×186 μm, and which is mounted on a portable media player (PMP) manufactured by REIGNCOM. FIG. 2 is a diagram showing a cross section of an organic light emitting device including an anode, a cathode, and organic emission layer.

As can be seen from FIGS. 1 and 2, anodes 20R, 20G, and 20B have a wider area than R, G, and B organic emission layers 10R, 10G, and 10B and are formed to be disposed on the lower portions of the R, G, and B emitting layers 10R, 10G, and 10B.

In FIG. 1, the distance $I_a$ between i) the organic emission layers 10R, 10G, and 10B that are disposed on the upper portions of the anodes 20R, 20G, and 20B and ii) the corner portions of the anodes 20R, 20G, and 20B is about 4 μm. The distance $I_b$ between the RGB organic emission layers is about 25 μm. In addition, a longitudinal length $I_T$ of the organic emission layer is about 172 μm and a width $W_R$, $W_G$, and $W_B$ of the RGB organic emission layers is about 37 μm, about 26 μm, and about 37 μm, respectively.

The pixel of the above device is formed to have the same anode area on each of the lower portions of the RGB organic emission layers, as can be seen from FIG. 1. As a result, the anode that is wider than organic emission layer reflects external light. In other words, as can be seen from FIG. 2, light which transmits through a pixel defining layer (PDL) 6 is reflected by the anode. This reflection degrades outdoor visibility of an OLED device.

Recently, as organic light emitting devices are increasingly used as part of a mobile apparatus, such as mobile phones, the organic devices are frequently used in the outdoor environment. In this case, external light such as sunlight is incident on the surface of the light emitting device and reflected. The reflected light causes inconvenience to the user of the device. The reflection from the organic light emitting device is generated in all the layers on its panel.

The surface reflectivity of external light on the FIG. 1 device has been tested by using the GA-4 inch model having a sub-pixel size of 62 μm×186 μm. The surface reflection from an Encap glass 2 (the combination of reflectances (a) and (b) of FIG. 2) is about 8.8%; the reflection from the PDL and the cathode 4 (reflection (c) of FIG. 2) is about 42.1%; and the reflection from the pixel 20 (reflection (d) of FIG. 2) is about 48.5%. On the other hand, the reflection from the lower portion of the pixel ((e) reflection of FIG. 2) is only about 0.1%. That is, the reflection from the pixel occupies about half of the entire reflectivity.

One aspect is to improve the outdoor visibility of the organic light emitting device by reducing the reflection from its pixels. Hereinafter, exemplary embodiments will be described more fully below with reference to the accompanying drawings. As those skilled in the art would realize, the described embodiments may be modified in various different ways, all without departing from the spirit or scope of the present embodiments. The drawings and description are to be regarded as illustrative in nature and not restrictive. Like reference numerals designate like elements throughout the specification.

Figure 3:
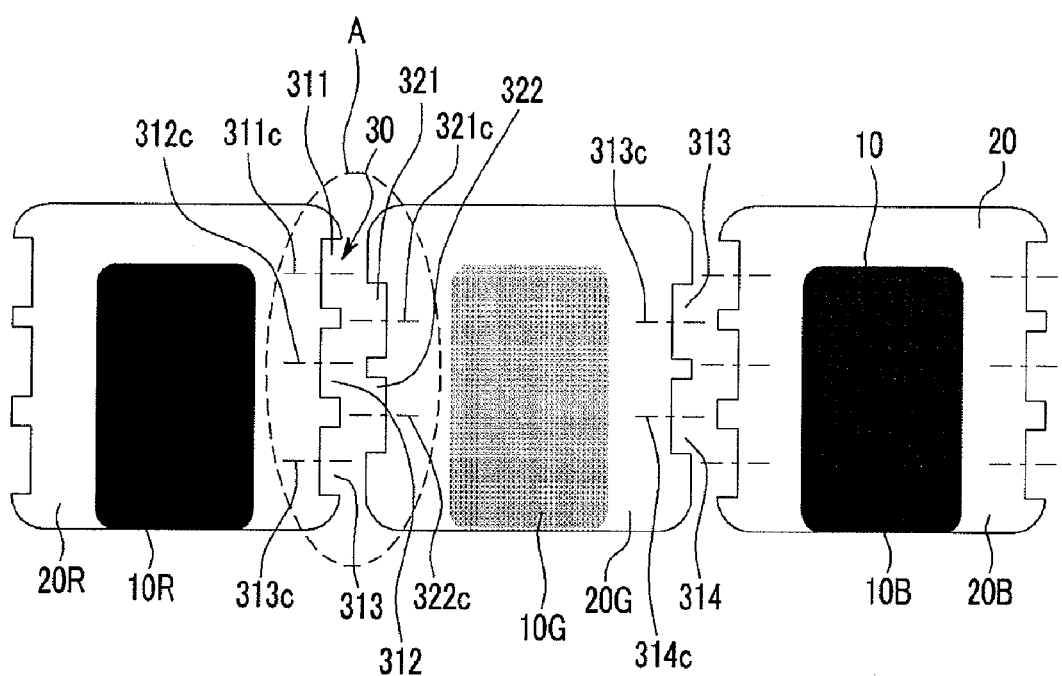
FIG. 3 is a diagram showing a pixel structure according to an exemplary embodiment.
Figure 4:
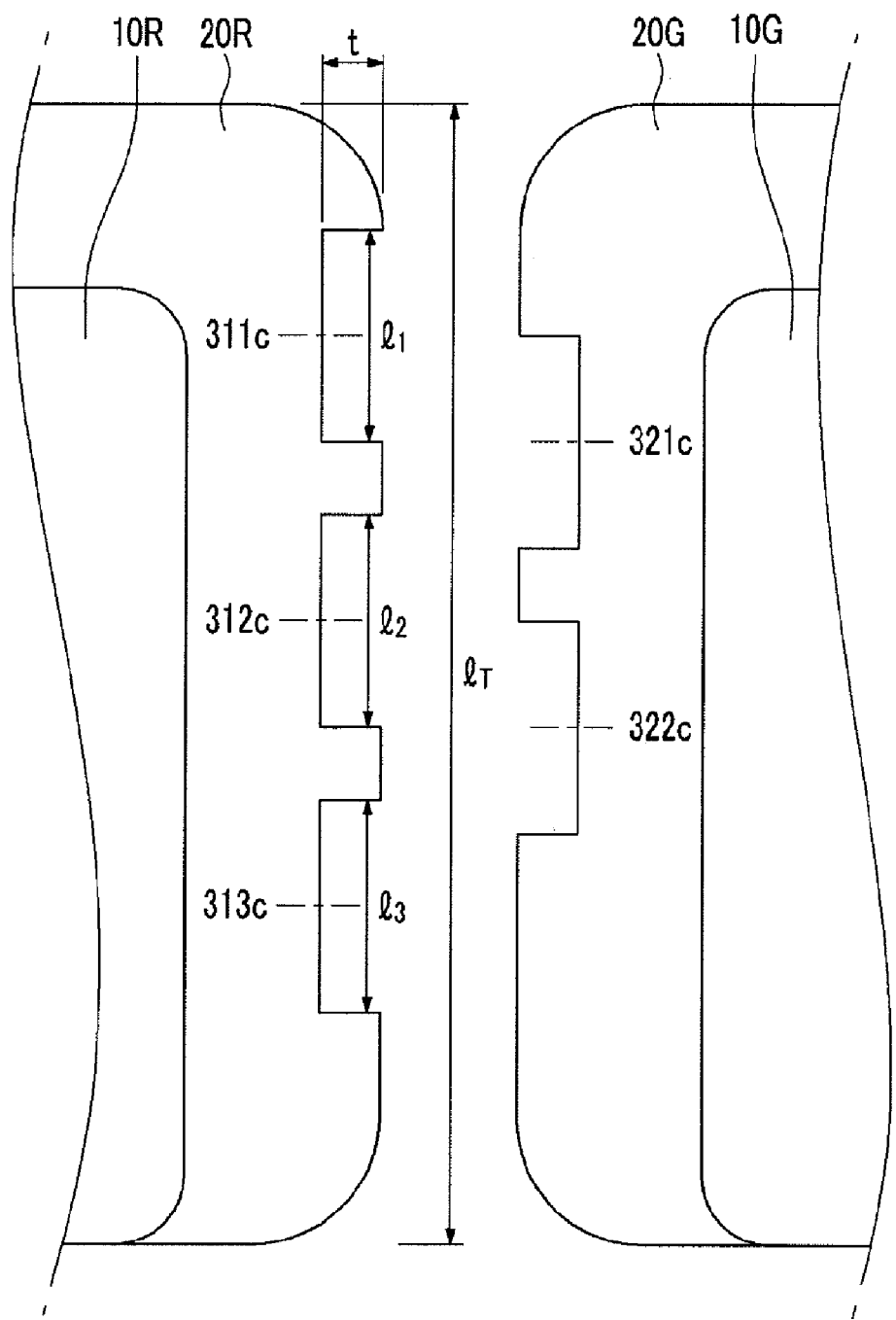
FIG. 4 is an enlarged view of portion A of FIG. 3.

FIG. 3 is a plan view showing a pixel structure of the organic light emitting device according to an exemplary embodiment and FIG. 4 is an enlarged view of portion A of FIG. 3.

Referring to FIGS. 3 and FIG. 4, a pixel structure 20 of an organic light emitting device has a form that adjacent edge parts of adjacent RGB pixels are externally patterned. The "adjacent edge parts" refer to the portions of the anodes, like 20, that extend past the edges of organic emission layers 10R, 10B and 10G. Further, the term refers to the portions of the anodes adjacent to other pixels, such as area 30, in FIG. 3 and as depicted in $I_T$ in FIG. 4. Further, the "external patterning" means that grooves 311, 312, 313, 313, 314, and 321 are formed in the adjacent edge parts of the pixels. Although the FIG. 3 embodiment shows the anodes with only two sides that are externally patterned, more than two sides of each anode can be externally patterned, as long as they do not interfere with the organic emission layers 10R, 10G, and 10B.

As described above, the external patterning 30 of the anode reduces of the area of the anodes 20R, 20G, and 20B. In the exemplary embodiment, the area of the anodes 20R, 20G, and 20B is reduced without reducing the area of the organic emission layers 10R, 10G, and 10B, such that the amount of external light reflected by the anodes 20R, 20G, and 20B is reduced. Since external light reflection is reduced, the outdoor visibility is improved.

In the exemplary embodiment, the external patterning 30 of the anodes 20R, 20G, and 20B is formed in a plurality of grooves 311, 312, 313, 313, 314, and 321 at left and right edge parts of the anodes in each pixel.

The depth (t of FIG. 4) of the grooves 311, 312, 313, 313, 314, 321, and 322 may be formed up to the depth where the organic emission layers 10R, 10G, and 10B are positioned from the outer side of the anodes 20R, 20G, and 20B to the inner side thereof. For example, in case of a GA-4 inch model having a sub-pixel size of 62 μm×186 μm, the depth of the groove may be formed up to about 4 μm. In one embodiment, the depth (t) of the groove formed by the external patterning is not formed to be positioned up to the lower side of the emitting layer.

Further, the depth of the groove may be formed such that the size and light emitting performance of the organic emission layer on the upper side of the anode are not affected by the external patterning 30 formed at the adjacent edge parts of the anodes 20R, 20G, and 20B.

Meanwhile, referring to FIGS. 3 and 4, the external patterning 30 formed at the mutually facing adjacent edge parts of the adjacent pixels is formed so that the central axes 311c, 312c, 313c, 313c, 321c, and 322c of the grooves 311, 312, 313, 313, 321, and 322 formed by the external patterning 30 do not overlap with each other between the pixels. The fact that the central axes does not overlap with each other means that the central axes of the grooves between the adjacent pixels do not conform to each other in a transverse direction, as shown in FIG. 4.

As described above, in the present exemplary embodiment, the reason why the central axes 311c, 312c, 313c, 313c, 321c, and 322c of the grooves between the adjacent pixels are formed so as not to overlap with each other is to prevent the generation of dark points by pressing and short circuit caused due to upper foreign materials when the interval between the pixels is not sufficiently spaced.

In more detail, there are various factors that cause the dark points in the organic light emitting device. One of the factors is the generation of alloys by the reaction of Cu and Mg of the inner plate at the time of depositing the cathode.

Such alloys serve as impurities in the modulation process of the organic light emitting element and when the foreign materials are compressed, the dark points occur by the pressing of the foreign materials.

Further, the generated alloy impurities may likely cause a short circuit between the pixels.

Therefore, in the present exemplary embodiment, when the external patterning 30 is formed, the pixels are spaced such that the central axes of the pattern grooves between the adjacent pixels do not overlap with each other. This configuration makes it possible to reduce the possibility of the short circuit by the alloy impurities.

Meanwhile, in the exemplary embodiment, the patterning region formed in one pixel is formed so as not to exceed about 50% of the entire longitudinal length of an electrode in the pixel, as shown in FIG. 4. In other words, in FIG. 4, the sum $(I_1+I_2+I_3)$ of the patterned longitudinal lengths of one pixel is formed to be smaller than about half of the entire length $(I_T)$.

If the patterned portion is formed to exceed about 50% of the entire longitudinal length of the pixel electrode, the PDL directly contacts the pixel layer, which may reduce adhesion to the ITO.

The PDL layer serves to press the edge cut portion of the electrode generated after etching ITO. If the patterned portion of the anode exceeds about 50%, the adhesion to the ITO may be reduced. Therefore, in order to prevent the problem of the reduction in adhesion, in the present exemplary embodiment, the patterning region is formed at about 50% or less of the entire longitudinal length.

Figure 5:
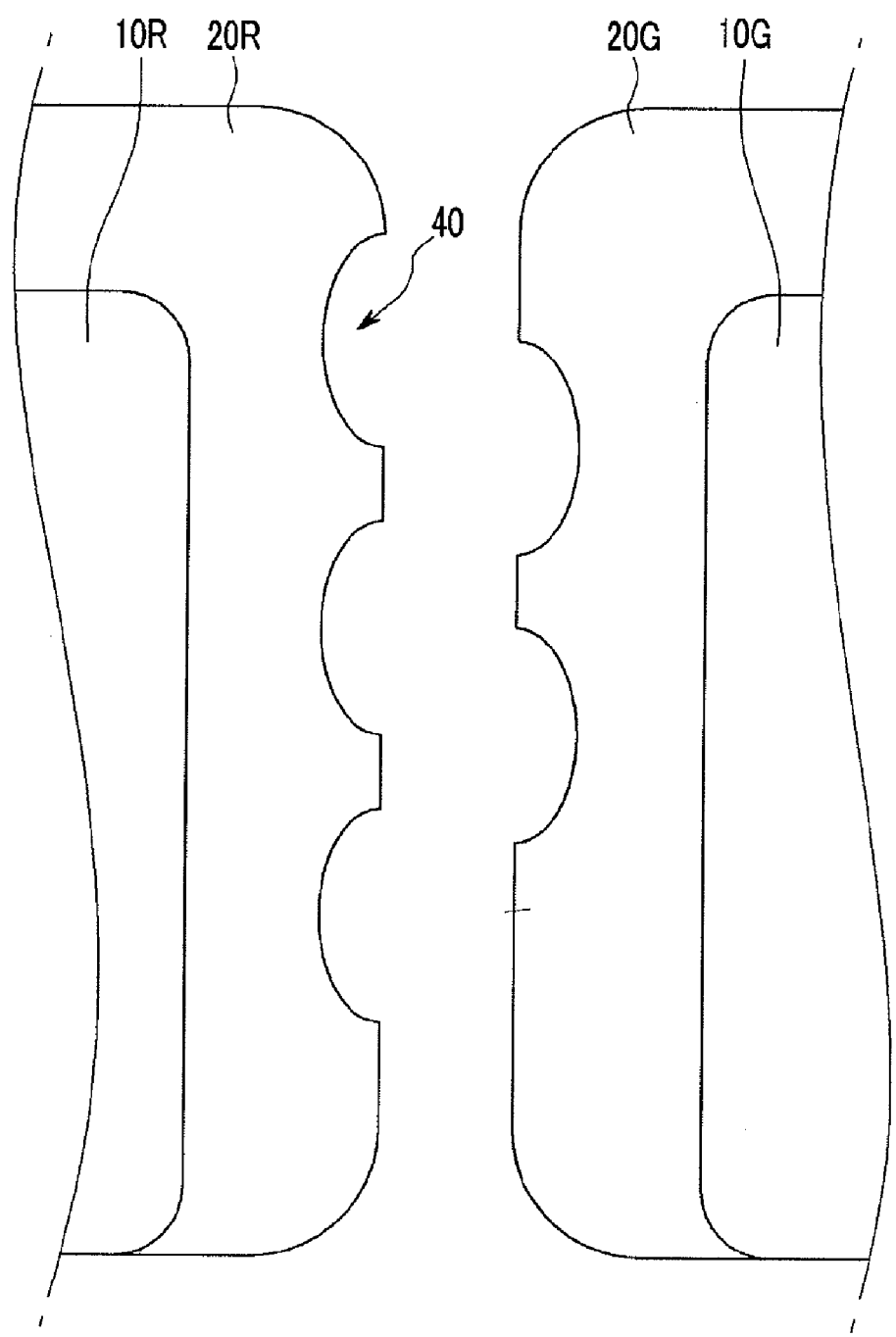
FIG. 5 is a diagram showing a pixel structure according to another exemplary embodiment.

Meanwhile, in the exemplary embodiment, the patterning shape that is formed in the anode is formed to have a substantially rectangular shape, as can be seen from FIG. 4. At this time, the patterning shape can be made in a substantially rectangular groove shape as well as in various patterning shapes 40 such as an oval groove shape or a circular groove shape, as can be seen from FIG. 5.

Figure 6:
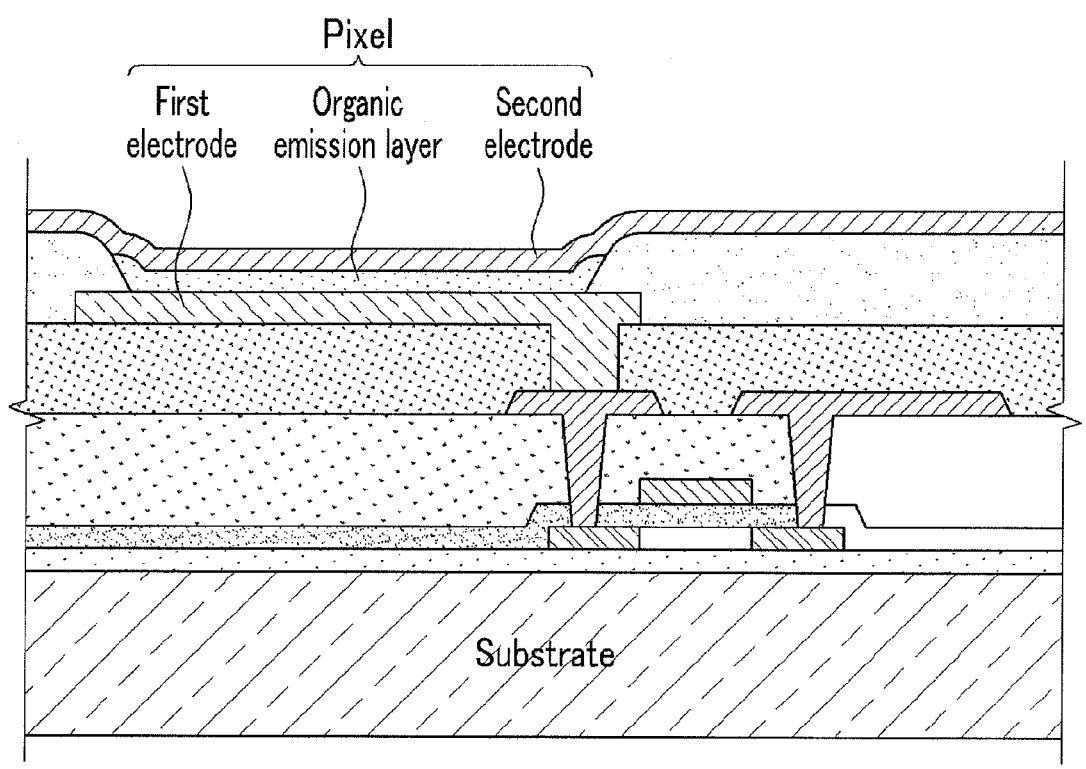
FIG. 6 is a cross-sectional view of an organic light emitting device according to an exemplary embodiment.

FIG. 6 is a cross-sectional view of an organic light emitting device according to an exemplary embodiment. FIG. 6 shows a substrate and a pixel that includes a first electrode (anode), organic emission layer and a second electrode (cathode).

In the present exemplary embodiment, forming the external patterning in the anode of the pixel can be implemented by manufacturing the anode by changing the design of the anode shape in the manufacturing process of the pixel. The organic light emitting device according to at least one embodiment can improve the outdoor visibility in a simple manner without adding a separate process in the manufacturing process of the existing organic light emitting device.

At least one embodiment can reduce external light reflection without loss of luminance and without adversely affecting the organic emission layers. In addition, the outdoor visibility can be improved by reducing the area of the electrode through the external patterning of the anode electrode. Moreover, the inter-electrode short due to the patterning can be prevented, since adjacent pixels do not contact each other.

Although the exemplary embodiments are described, the spirit of the present invention is not limited to the exemplary embodiments described in the specification. A person of an ordinary skill in the art understanding the spirit of the present invention can easily propose another exemplary embodiment by adding, changing, deleting, etc., of constituent elements within the scope of the present invention, which should be construed as being included in the scope of the present invention.

What is claimed is:

1. An organic light emitting device including a plurality of pixels formed on a substrate, wherein each of the pixels comprises:
    a first electrode layer formed on the substrate;
    an organic emission layer formed on the first electrode layer; and
    a second electrode layer formed on the organic emission layer,
    wherein at least one of the first electrode layers of the pixels is externally patterned,
    wherein each of the first electrode layers of the pixels has two opposing sides which face at least one side of the first electrode layer of an adjacent pixel, wherein at least one of the two opposing sides is externally patterned, and wherein a plurality of grooves are formed in each of the opposing sides.

2. The organic light emitting device of claim 1, wherein the pixels are red (R), green (G), and, blue (B) pixels.

3. The organic light emitting device of claim 2, wherein all of the first electrodes of the R, G and B pixels are externally patterned.

4. The organic light emitting device of claim 1, wherein the grooves of the first electrode layer are alternately formed with respect to the grooves of the adjacent first electrode layer.

5. The organic light emitting device of claim 1, wherein each of the grooves has substantially the same length and depth.

6. The organic light emitting device of claim 1, wherein the length of the grooves is less than about 50% of the length of each of the opposing sides of the first electrode layer.

7. The organic light emitting device of claim 1, wherein the grooves do not contact the organic emission layer.

8. The organic light emitting device of claim 1, wherein the grooves have a substantially rectangular shape.

9. The organic light emitting device of claim 1, wherein the grooves have an arc shape or an oval shape.

10. The organic light emitting device of claim 1, wherein the central axis of each of the grooves in one of the pixels does not overlap with the central axis of each of the grooves in an adjacent pixel.

11. The organic light emitting device of claim 1, wherein the grooves are formed only in the two opposing sides of each of the first electrode layer.

12. An organic light emitting device including a plurality of pixels formed on a substrate, wherein each of the pixels comprises:
    a first electrode layer formed on the substrate;
    an organic emission layer formed on the first electrode layer; and a second electrode layer formed on the organic emission layer, wherein at least one of the first electrode layers of the pixels is externally patterned, and wherein a plurality of grooves are formed in more than two sides of the first electrode layer, and wherein at least one of the sides does not face the first electrode layer of an adjacent pixel.

13. An organic light emitting device, comprising:

a substrate; and a plurality of pixels formed over a substrate, wherein each of the pixels comprises:

first and second electrodes formed over the substrate, wherein the first electrode is closer to the substrate than the second electrode; and an organic emission layer formed between the first and second electrodes, wherein each of the first electrodes of the pixels has two opposing sides which face at least one side of the first electrode of an adjacent pixel, wherein at least one of the two opposing sides is patterned, and wherein a plurality of grooves are formed in each of the opposing sides.

14. The organic light emitting device of claim 13, wherein the grooves of the first electrode are alternately formed with respect to the grooves of the adjacent first electrode.

15. An organic light emitting device, comprising:

a substrate;

first, second and third pixels formed over the substrate, wherein the second pixel is formed between and spaced apart from the first and third pixels, wherein each of the first, second and third pixels comprises:

an organic emission layer; and an electrode formed below the organic emission layer, wherein the electrode is closer to the substrate than the organic emission layer, wherein the first electrode of the second pixel has two opposing sides which face the first electrodes of the first and third pixels, and wherein a plurality of grooves are formed in each of the opposing sides.

16. The organic light emitting device of claim 15, wherein at least one of the first and third pixels has two opposing sides which face the two opposing sides of the second pixel, and wherein a plurality of grooves are formed in each of the opposing sides of the first and/or third pixel.

17. The organic light emitting device of claim 16, wherein the grooves of the second pixel are alternately formed with and face the grooves of the first and/or third pixels so that the central axis of each of the grooves in the second pixel does not overlap with the central axis of each of the grooves in the first and/or third pixels.

* * * * *